United States Patent
Wu

(10) Patent No.: US 10,248,831 B1
(45) Date of Patent: Apr. 2, 2019

(54) FLAT-PANEL DISPLAY EMBEDDED WITH A FINGERPRINT SENSOR AND A METHOD OF FORMING THE SAME

(71) Applicant: HIMAX TECHNOLOGIES LIMITED, Tainan (TW)

(72) Inventor: Ilin Wu, Tainan (TW)

(73) Assignee: Himax Technologies Limited, Tainan (TW)

( * ) Notice: Subject to any disclaimer, the term of this patent is extended or adjusted under 35 U.S.C. 154(b) by 14 days.

(21) Appl. No.: 15/857,248

(22) Filed: Dec. 28, 2017

Related U.S. Application Data

(60) Provisional application No. 62/556,129, filed on Sep. 8, 2017.

(51) Int. Cl.
   *H01L 51/52* (2006.01)
   *G06K 9/00* (2006.01)
   (Continued)

(52) U.S. Cl.
   CPC ......... *G06K 9/0004* (2013.01); *G02F 1/1368* (2013.01); *G02F 1/13338* (2013.01); *G02F 1/13394* (2013.01); *G02F 1/133512* (2013.01); *G02F 1/133516* (2013.01); *G02F 1/133526* (2013.01); *H01L 27/3234* (2013.01); *H01L 31/02164* (2013.01); *H01L 31/02327* (2013.01); *H01L 31/03682* (2013.01); *H01L 31/103* (2013.01); *H01L 31/182* (2013.01); *G02F 1/136286* (2013.01); *G02F 2001/13398* (2013.01); *G02F 2001/13685* (2013.01); *G02F 2001/133357* (2013.01); *G02F 2202/104* (2013.01); *H01L 27/1124* (2013.01); *H01L 27/1222* (2013.01); *H01L 27/1248* (2013.01); *H01L 27/322* (2013.01);
   (Continued)

(58) Field of Classification Search
   CPC .......... H01L 27/14621; H01L 27/3248; H01L 27/3276; H01L 27/124; H01L 27/1251; H01L 27/14607; H01L 27/14609; H01L 27/1461; H01L 27/14612; H01L 27/14627; H01L 27/14636; H01L 27/14645
   See application file for complete search history.

(56) References Cited

U.S. PATENT DOCUMENTS 7,443,005 B2 * 10/2008 Kuo .................. H01L 27/14621
                                                            257/432
9,391,113 B2 * 7/2016 Chiu .................. H01L 27/14636
(Continued)

FOREIGN PATENT DOCUMENTS

CN     106773229 A      5/2017
CN     107077605 A      8/2017

OTHER PUBLICATIONS

Office Action dated May 10, 2018 in corresponding Taiwan Patent Application No. 106142634.

*Primary Examiner* — Thanh Y Tran
(74) *Attorney, Agent, or Firm* — Daniel E. Stout; Stout, Uxa & Buyan, LLP

(57) ABSTRACT

A flat-panel display embedded with a fingerprint sensor includes a substrate, a photo sensor formed on a bottom surface of the substrate, a lens region disposed above and substantially aligned with the photo sensor vertically, and a light barrier substantially aligned with the photo sensor vertically and disposed between the photo sensor and the lens region.

16 Claims, 19 Drawing Sheets

(51) Int. Cl.
*G02F 1/1368* (2006.01)
*G02F 1/1339* (2006.01)
*H01L 31/0232* (2014.01)
*H01L 31/0216* (2014.01)
*H01L 31/0368* (2006.01)
*H01L 31/18* (2006.01)
*H01L 27/32* (2006.01)
*H01L 31/103* (2006.01)
*G02F 1/1335* (2006.01)
*G02F 1/1333* (2006.01)
*H01L 27/112* (2006.01)
*H01L 27/12* (2006.01)
*H01L 29/786* (2006.01)
*G02F 1/1362* (2006.01)

(52) U.S. Cl.
CPC .... *H01L 27/3276* (2013.01); *H01L 29/78675* (2013.01); *H01L 51/525* (2013.01); *H01L 2227/323* (2013.01)

(56) References Cited

U.S. PATENT DOCUMENTS

| | | | |
|---|---|---|---|
| 2008/0116537 A1* | 5/2008 | Adkisson | H01L 27/14618 257/448 |
| 2008/0135837 A1* | 6/2008 | Kim | H01L 29/4908 257/40 |
| 2009/0272880 A1* | 11/2009 | Stanton | H01L 27/14621 250/208.1 |
| 2018/0089491 A1* | 3/2018 | Kim | G02F 1/13338 |

* cited by examiner

FLAT-PANEL DISPLAY EMBEDDED WITH A FINGERPRINT SENSOR AND A METHOD OF FORMING THE SAME

CROSS-REFERENCE TO RELATED APPLICATIONS

This application claims the benefit of U.S. Provisional Application No. 62/556,129, filed on Sep. 8, 2017, the entire content of which is hereby incorporated by reference.

BACKGROUND OF THE INVENTION

1. Field of the Invention

The present invention generally relates to a fingerprint sensor, and more particularly to a flat-panel display embedded with a fingerprint sensor.

2. Description of Related Art

A mobile device, such as a smartphone, is a computing device small enough to hold and operate in the hand. The mobile device typically has a touchscreen that occupies substantial front surface (e.g., 70%) of the mobile device.

Modern mobile devices may have or be able to perform many functions adaptable to wide variety of purposes such as social interaction, financial transactions, and personal or business communications. With this concern, fingerprint is one of many forms of biometrics used to identify individuals and verify their identity in order to protect confidential or sensitive data stored in the mobile devices. Fingerprint recognition is not only a secure way of identifying individuals, but also a quick means for accessing the mobile device.

Many mobile devices (e.g., smartphones) have been equipped with fingerprint recognition, which is typically implemented with a physical button disposed on the front surface, for example, below and external to the touchscreen. Placing a fingerprint button on the front surface of the mobile devices is unfortunately in contradiction with the trend toward a bigger touchscreen that can accommodate more functions as the mobile devices become more powerful.

For the reason that expandability of the conventional mobile devices is hindered by placing a fingerprint button on the mobile devices, a need has thus arisen to propose a novel scheme to effectively provide fingerprint recognition in mobile devices.

SUMMARY OF THE INVENTION

In view of the foregoing, it is an object of the embodiment of the present invention to provide a flat-panel display, such as liquid crystal display (LCD) or organic light-emitting diode (OLED) display, embedded with a fingerprint sensor.

According to one embodiment, a flat-panel display includes a substrate, a photo sensor, a lens region and a light barrier. The photo sensor is formed on a bottom surface of the substrate. The lens region is disposed above and substantially aligned with the photo sensor vertically. The light barrier is substantially aligned with the photo sensor vertically and disposed between the photo sensor and the lens region.

DETAILED DESCRIPTION OF THE INVENTION

Figure 1:
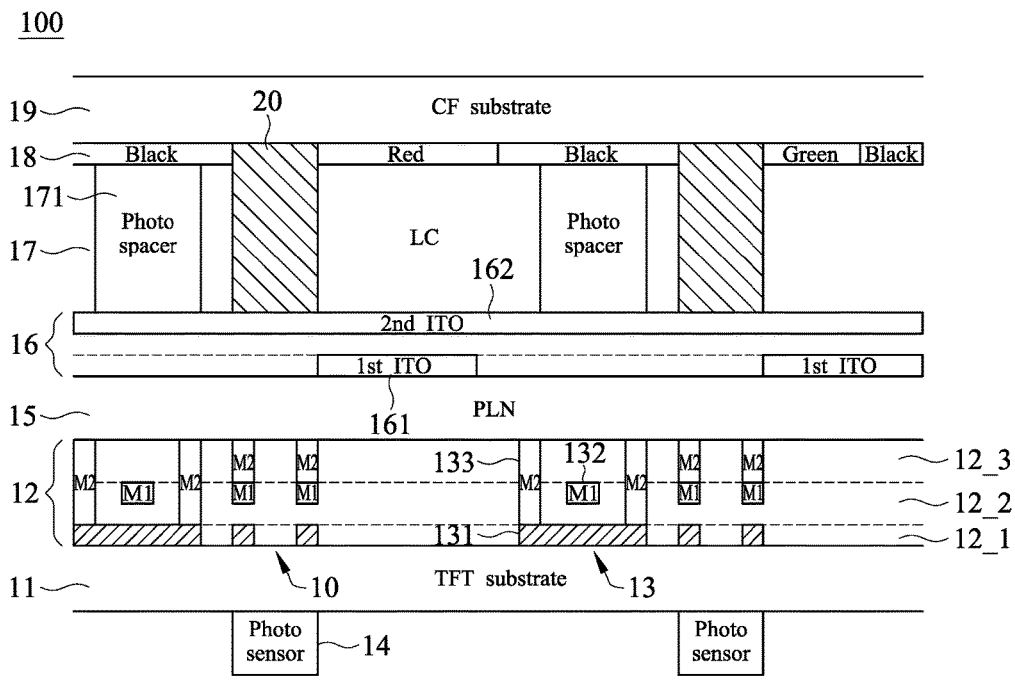
FIG. 1 shows a cross-sectional view of a liquid crystal display (LCD) embedded with a fingerprint sensor according to a first embodiment of the present invention.

FIG. 1 shows a cross-sectional view of a liquid crystal display (LCD) 100 embedded with a fingerprint sensor, which is integrated in an active area of the LCD 100, according to a first embodiment of the present invention. The LCD 100 may, for example, a thin-film transistor (TFT) LCD. For better understanding the present invention, only elements pertinent to aspects of the embodiment have been shown.

In the embodiment, the LCD 100 may include a TFT substrate 11, on a top surface of which a first dielectric layer 12 is formed. The first dielectric layer 12 may, for example, be made of silicon oxide (SiO) and/or silicon nitride (SiN). A plurality of TFTs 13 are formed in the first dielectric layer 12. The TFT 13 may include a polysilicon (abbreviated as poly) layer (as a channel) 131, a first metal layer (as a gate) 132 disposed above the polysilicon layer 131, and a second metal layer (as source and drain) 133 disposed on the polysilicon layer 131 and enclosing the first metal layer 132, where the first metal layer (M1) 132 is insulated from the second metal layer (M2) 133 by the first dielectric layer 12.

According to one aspect of the embodiment, at least one photo sensor (or photo detector) 14 is formed on a bottom surface of the TFT substrate 11. The photo sensor 14 may include a complementary metal-oxide-semiconductor (CMOS) image sensor. The LCD 100 of the embodiment may include a light source such as backlight module (not shown) disposed below the TFT substrate 11. The light source of the LCD 100 may emit a visible or invisible light beam.

According to another aspect of the embodiment, a light barrier 10 substantially aligned with the photo sensor 14 vertically is formed in the first dielectric layer 12. In the embodiment, the light barrier 10 may include the polysilicon layer 131, the first metal layer 132 and the second metal layer 133 that surround a passage. A light beam representing a fingerprint passes the lens region 20 and the passage, and is then detected by the photo sensor 14. The light barrier 10 may be utilized to block or shield (oblique) light coming from directions other than the passage direction leading to the photo sensor 14.

The LCD 100 of the embodiment may include a transparent planarization (PLN) layer 15, with a substantially smooth top surface, formed over the first dielectric layer 12. The planarization layer 15 is made of a transparent material such as resin, through which light is allowed to transmit.

The LCD 100 of the embodiment may include a second dielectric layer 16 formed on the planarization layer 15. The second dielectric layer 16 may, for example, be made of silicon oxide (SiO) and/or silicon nitride (SiN). At least one conductive layer is formed in the second dielectric layer 16. As exemplified in FIG. 1, the at least one conductive layer may include a first indium tin oxide (ITO) layer 161 formed at the bottom of the second dielectric layer 16 (e.g., formed on the planarization layer 15) and a second ITO layer 162 formed at the top of the second dielectric layer 16 (e.g., formed over the first ITO layer 161). The first ITO layer 161 is insulated from the second ITO layer 162 by the second dielectric layer 16.

The LCD 100 of the embodiment may include a liquid crystal (LC) layer 17 formed over the second dielectric layer 16. At least one transparent photo spacer 171 is disposed in the LC layer 17 to isolate adjacent LC regions from each other. The photo spacer 171 of the LCD 100 may be made of a transparent material such as resin. The LCD 100 may further include a color filter (CF) layer 18 formed over the LC layer 17. The CF layer 18 is disposed on a bottom surface of a CF substrate 19. The CF layer 18 may include a plurality of color filters such as red, green and blue filters, through which red, green and blue lights can transmit, respectively. The CF layer 18 may also include at least one black filter, through which no light can transmit. The areas not covered by the black filter constitute a display area. As shown in FIG. 1, the black filter is substantially aligned with the underlying photo spacer 171. In the embodiment, the photo sensor 14 is in an active display area not overlapping with a black filter of the CF layer 18.

According to a further aspect of the embodiment, the LCD 100 may include at least one lens region 20 disposed above and substantially aligned with the photo sensor 14 vertically. In the embodiment, the lens region 20 is protruded upwards from, and connected to, a top surface of the planarization layer 15. The lens region 20 may include a transparent material, which may be the same as or different from the planarization layer 15. Specifically, the lens region 20 is elongated vertically and passes through, from bottom to top, the second dielectric layer 16, the LC layer 17 and the CF layer 18.

Figure 2:
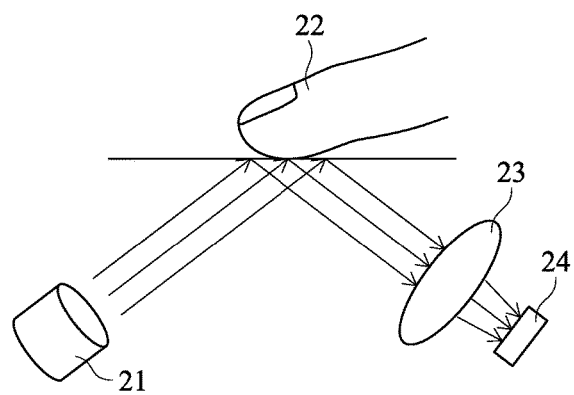
FIG. 2 shows a schematic diagram functionally illustrating the fingerprint sensor of the embodiment.

According to the embodiment disclosed above, the LCD 100 is embedded with a fingerprint sensor composed of the light source, the lens region 20 and the photo sensor 14. FIG. 2 shows a schematic diagram functionally illustrating the fingerprint sensor of the embodiment. Specifically, a light source 21 emits a light beam towards a finger 22. The lens region 20 acts as a rod lens 23 that focuses the light beam reflected from a fingerprint. The light beam representing the fingerprint is then detected by the photo sensor 14, which acts a photo detector 24 that converts light into an electrical signal.

Figure 3A:
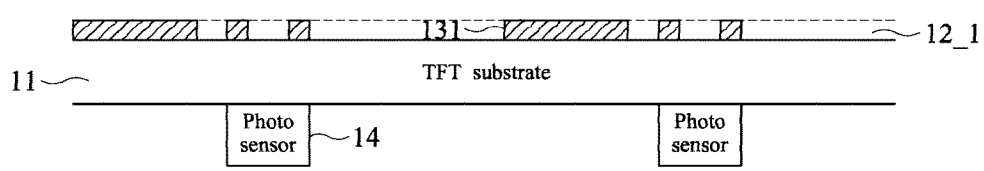
FIG. 3A to FIG. 3G show cross-sectional views illustrated of a method of forming the LCD of FIG. 1.
Figure 3B:
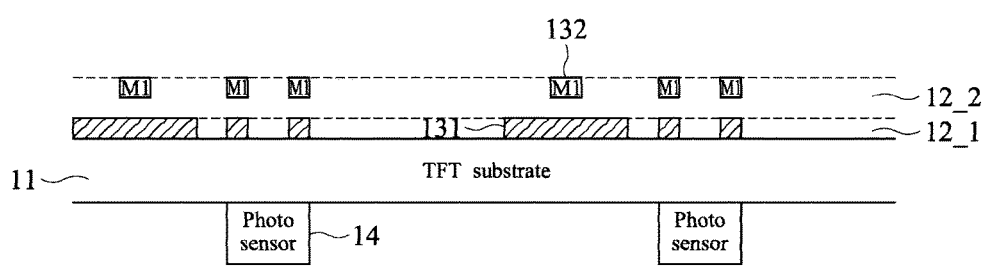
Figure 3C:
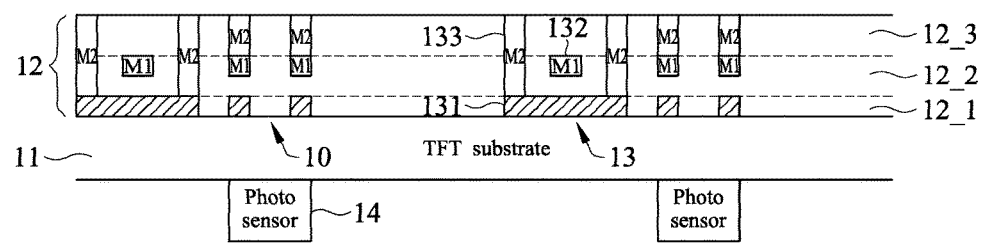
Figure 3D:
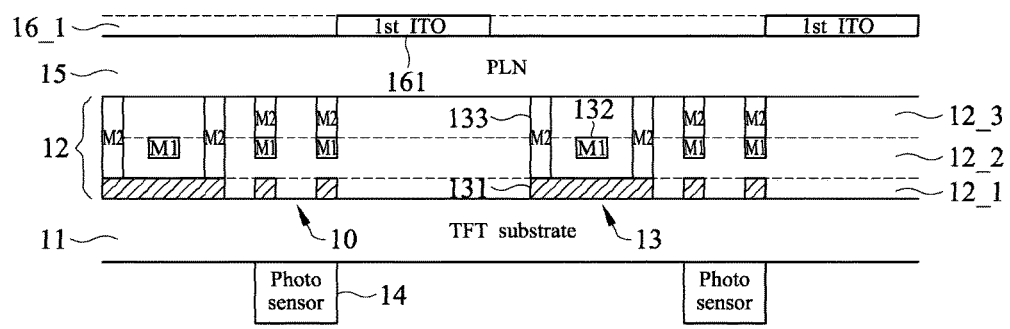
Figure 3E:
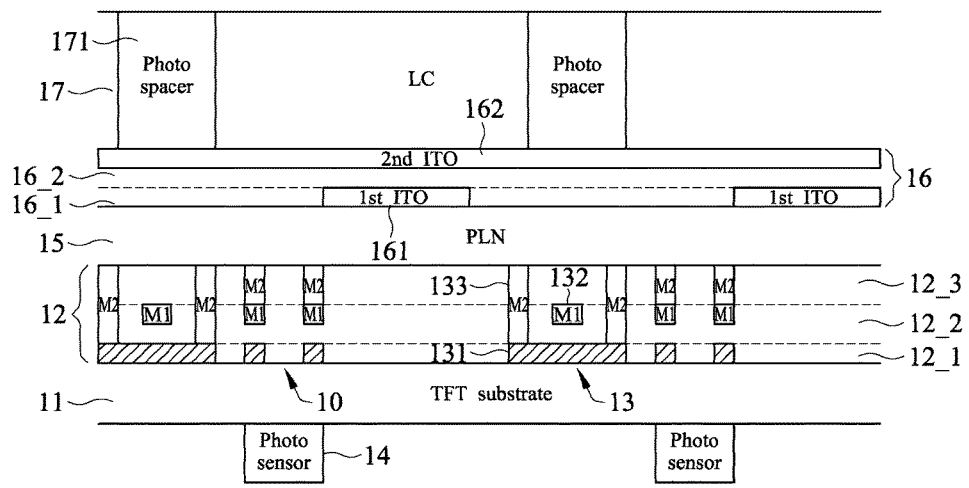
Figure 3F:
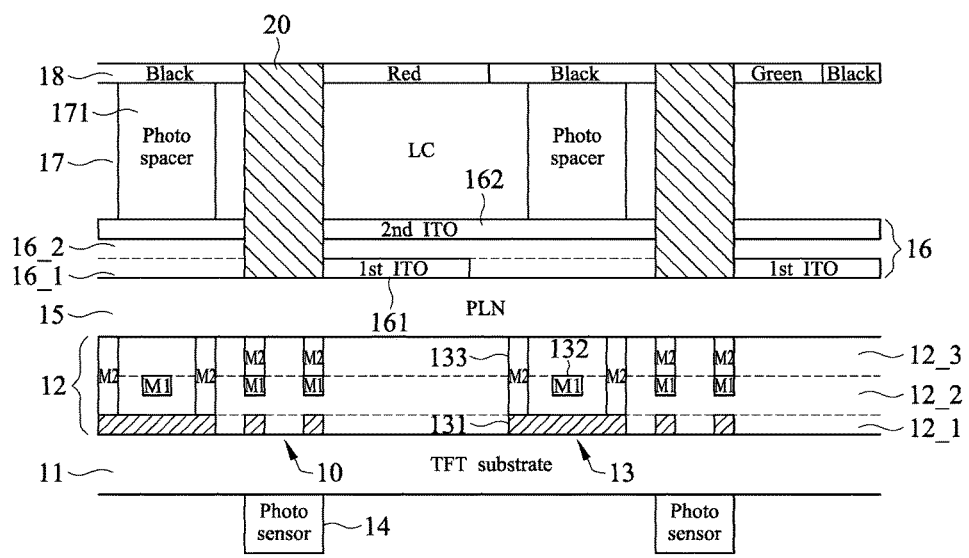
Figure 3G:
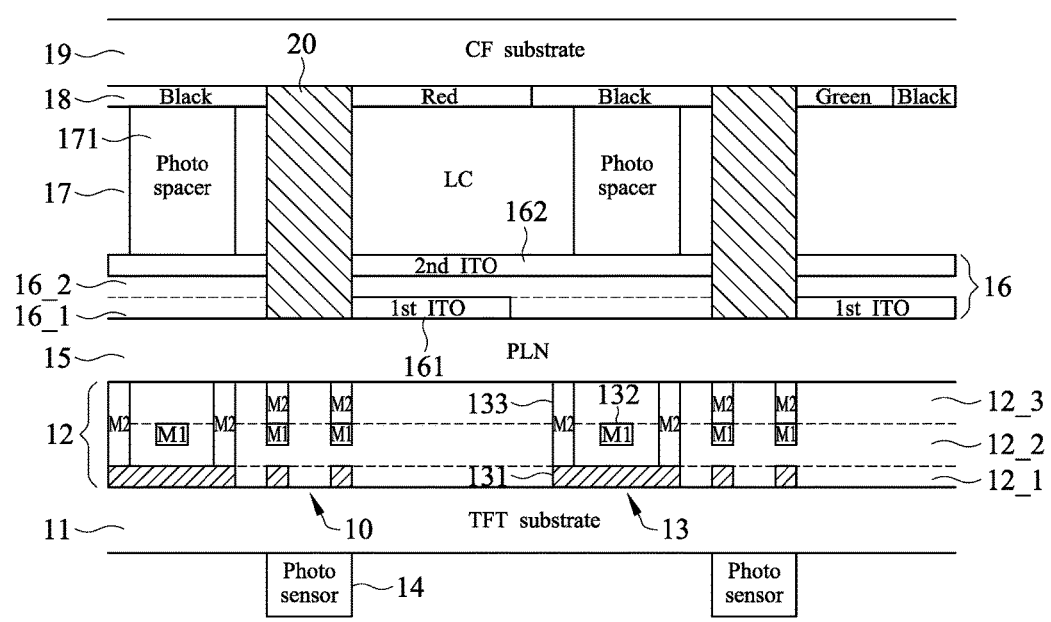

FIG. 3A to FIG. 3G show cross-sectional views illustrated of a method of forming the LCD 100 of FIG. 1. It is appreciated that the method of forming the LCD 100 may be performed in sequences other than that exemplified in FIG. 3A to FIG. 3G. Specifically, in FIG. 3A, a first layer 12_1 of a first dielectric layer 12 is formed on a top surface of a TFT substrate 11, followed by forming a polysilicon layer 131 in the first layer 12_1 of the first dielectric layer 12. At least one photo sensor (or photo detector) 14 is formed on a bottom surface of the TFT substrate 11. In FIG. 3B, a second layer 12_2 of the first dielectric layer 12 is formed on the first layer 12_1 of the first dielectric layer 12, followed by forming a first metal layer (M1) 132 in the second layer 12_2 of the first dielectric layer 12. In FIG. 3C, a third layer 12_3 of the first dielectric layer 12 is formed on the second layer 12_2 of the first dielectric layer 12, followed by forming a second metal layer (M2) 133 in the third layer 12_3 of the first dielectric layer 12. Accordingly, the TFT 13 and the light barrier 10 are formed in the first dielectric layer 12. In FIG. 3D, a planarization (PLN) layer 15 is formed over the first dielectric layer 12. Next, a first layer 16_1 of a second dielectric layer 16 is formed on the planarization layer 15, followed by forming a first indium tin oxide (ITO) layer 161 in the first layer 16_1 of the second dielectric layer 16. In FIG. 3E, a second layer 16_2 of the second dielectric layer 16 is formed on the first layer 16_1 of the second dielectric layer 16, followed by forming a second ITO layer 162 in the second layer 16_2 of the second dielectric layer 16. Next, a liquid crystal (LC) layer 17 is formed over the second dielectric layer 16, and at least one transparent photo spacer 171 is formed in the LC layer 17 to isolate adjacent LC regions from each other. In FIG. 3F, a color filter (CF) layer 18 is formed over the LC layer 17. Next, at least one lens region 20 is formed in the CF layer 18, the LC layer 17 and the second dielectric layer 16. The lens region 20 is connected to a top surface of the planarization layer 15, and is substantially aligned with the photo sensor 14 vertically. Finally, in FIG. 3G, a CF substrate 19 is formed to cover the CF layer 18.

Figure 4:
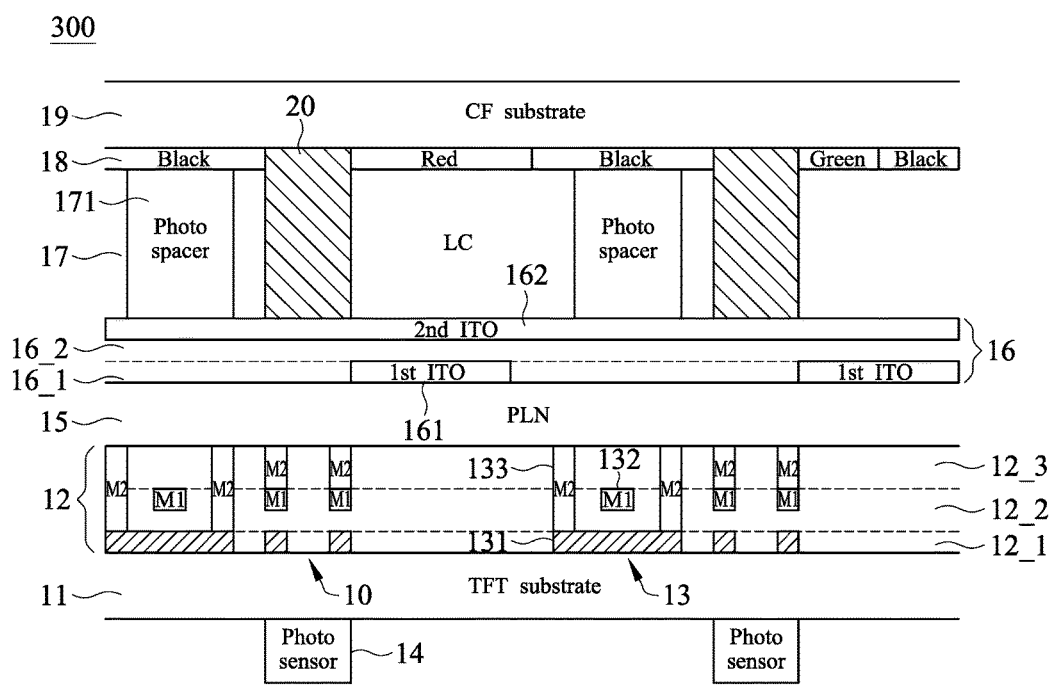
FIG. 4 shows a cross-sectional view of a liquid crystal display (LCD) embedded with a fingerprint sensor according to a second embodiment of the present invention.

FIG. 4 shows a cross-sectional view of a liquid crystal display (LCD) 300 embedded with a fingerprint sensor, which is integrated in an active area of the LCD 300, according to a second embodiment of the present invention. The present embodiment is similar to the first embodiment (FIG. 1) with the exceptions that will be described below.

In the embodiment, the lens region 20 is disposed in the LC layer 17, and is substantially parallel to the photo spacer 171. The lens region 20 may include a transparent material, which may be the same as or different from the photo spacer 171. Specifically, the lens region 20 is elongated vertically and passes through, from bottom to top, the LC layer 17 and the CF layer 18.

Figure 5A:
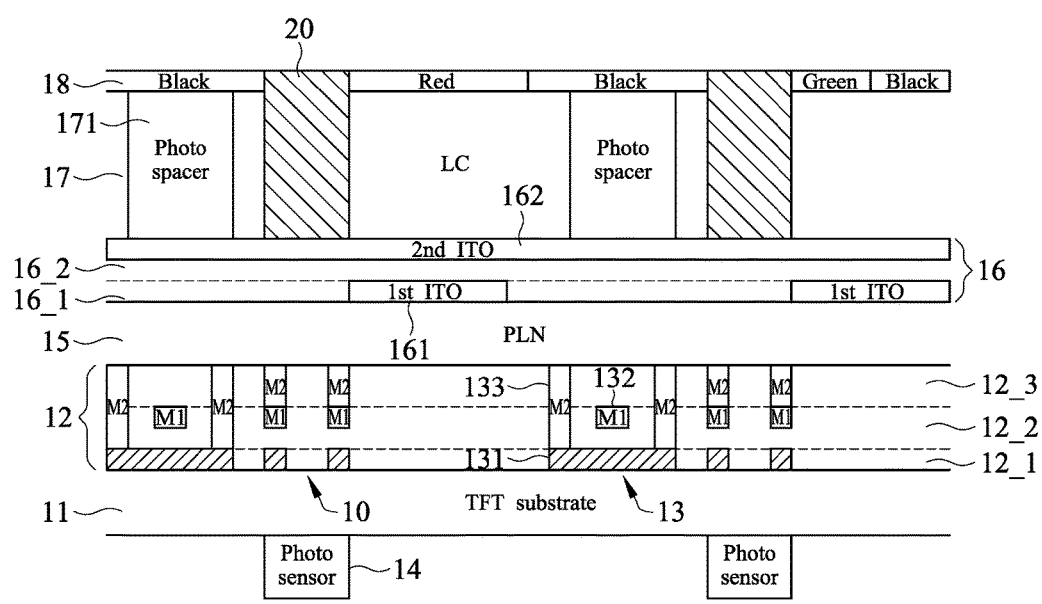
FIG. 5A to FIG. 5B show cross-sectional views illustrated of a method of forming the LCD of FIG. 4.
Figure 5B:
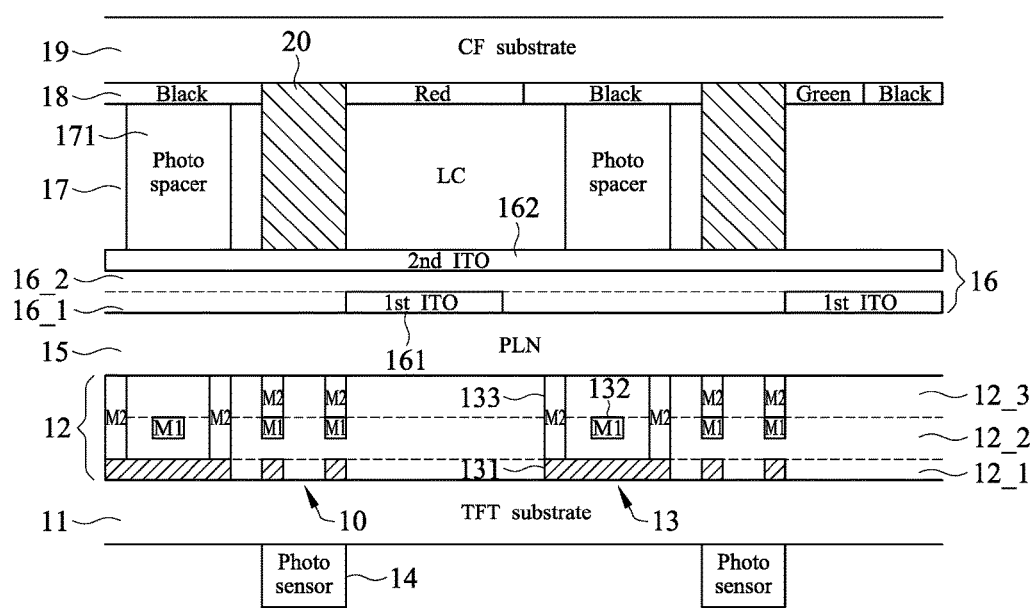

FIG. 5A to FIG. 5B show cross-sectional views illustrated of a method of forming the LCD 300 of FIG. 4. It is appreciated that the method of forming the LCD 300 may be performed in sequences other than that exemplified in FIG. 5A to FIG. 5B. The method of the embodiment may include same steps as shown in FIG. 3A to FIG. 3E. Subsequently, in FIG. 5A, a color filter (CF) layer 18 is formed over the LC layer 17. Next, at least one lens region 20 is formed in the CF layer 18 and the LC layer 17. The lens region 20 is connected to a top surface of the second dielectric layer 16, and is substantially aligned with the photo sensor 14 vertically. Finally, in FIG. 5B, a CF substrate 19 is formed to cover the CF layer 18.

Figure 6:
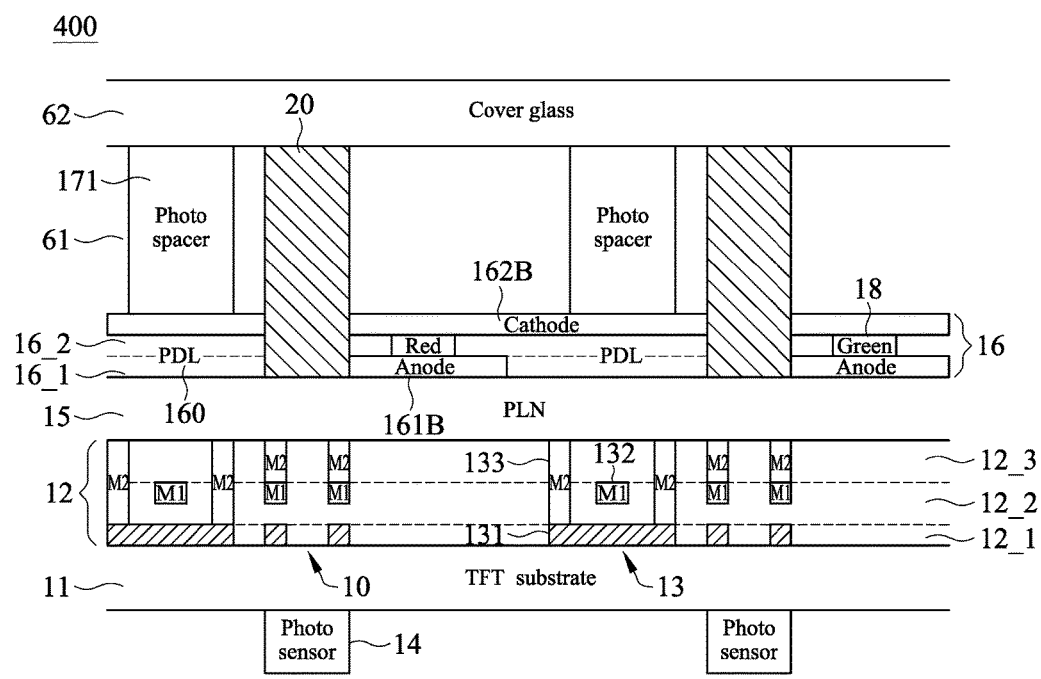
FIG. 6 shows a cross-sectional view of a light-emitting diode (LED) display embedded with a fingerprint sensor according to a third embodiment of the present invention.

FIG. 6 shows a cross-sectional view of a light-emitting diode (LED) display 400 embedded with a fingerprint sensor, which is integrated in an active area of the LED display 400, according to a third embodiment of the present invention. The LED display 400 may, for example, be an active-matrix organic light-emitting diode (AMOLED) display. For better understanding the present invention, only elements pertinent to aspects of the embodiment have been shown.

In the embodiment, the LED display 400 may include a TFT substrate 11, upon which a first dielectric layer 12 is formed. The first dielectric layer 12 may, for example, be made of silicon oxide (SiO) and/or silicon nitride (SiN). A plurality of TFTs 13 are formed in the first dielectric layer 12 and on the TFT substrate 11. The TFT 13 may include a polysilicon (abbreviated as poly) layer (as a channel) 131, a first metal layer (as a gate) 132 disposed above the polysilicon layer 131, and a second metal layer (as source and drain) 133 disposed on the polysilicon layer 131 and enclosing the first metal layer 132, where the first metal layer (M1) 132 is insulated from the second metal layer (M2) 133 by the first dielectric layer 12.

According to one aspect of the embodiment, at least one photo sensor (or photo detector) 14 is formed on a bottom surface of the TFT substrate 11. The photo sensor 14 may include a complementary metal-oxide-semiconductor (CMOS) image sensor. The LCD 400 of the embodiment may include a light source such as backlight module (not shown) disposed below the TFT substrate 11. The light source of the LCD 100 may emit a visible or invisible light beam.

According to another aspect of the embodiment, a light barrier 10 substantially aligned with the photo sensor 14 vertically is formed in the first dielectric layer 12. In the embodiment, the light barrier 10 may include the polysilicon layer 131, the first metal layer 132 and the second metal layer 133 that surround a passage. The light barrier 10 may be utilized to block or shield (oblique) light coming from directions other than the passage direction leading to the photo sensor 14.

The LED display 400 of the embodiment may include a planarization (PLN) layer 15, with a substantially smooth top surface, formed over the first dielectric layer 12. The planarization layer 15 is made of a transparent material such as resin, through which light is allowed to transmit.

The LED display 400 of the embodiment may include a second dielectric layer 16 formed on the planarization layer 15. The second dielectric layer 16 may, for example, be made of silicon oxide (SiO) and/or silicon nitride (SiN). The second dielectric layer 16 may include a transparent pixel define layer (PDL) 160, for example, formed on the planarization layer 15. At least one conductive layer is formed in the second dielectric layer 16. As exemplified in FIG. 6, the at least one conductive layer may include an anode layer 161B formed at the bottom of the second dielectric layer 16 (e.g., formed on the planarization layer 15) and a cathode layer 162B formed at the top of the second dielectric layer 16 (e.g., formed over the anode layer 161B). The anode layer 161B is insulated from the cathode layer 162B by the second dielectric layer 16. The LED display 400 may further include a color filter (CF) layer 18 formed in the second dielectric layer 16 (e.g., formed between the anode layer 161B and the cathode layer 162B). The CF layer 18 may include a plurality of color filters such as red, green and blue filters, through which red, green and blue lights can transmit, respectively. In the embodiment, the photo sensor 14 is in an active display area not overlapping with a black filter of the CF layer 18.

The LED display 400 of the embodiment may include an encapsulation layer 61 formed over the second dielectric layer 16. At least one transparent photo spacer 171 is disposed in the encapsulation layer 61 to isolate adjacent pixels from each other. The photo spacer 171 of the LED display 400 may be made of a transparent material such as resin.

According to another aspect of the embodiment, the LED display 400 may include at least one lens region 20 disposed above and substantially aligned with the photo sensor 14 vertically. In the embodiment, the lens region 20 is protruded upwards from, and connected to, a top surface of the planarization layer 15. The lens region 20 may include a transparent material, which may be the same as or different from the planarization layer 15. Specifically, the lens region 20 is elongated vertically and passes through the second dielectric layer 16 and the encapsulation layer 61. The LED display 400 may further include a cover glass 62 that covers the encapsulation layer 61, the photo spacer 171 and the lens region 20.

Figure 7A:
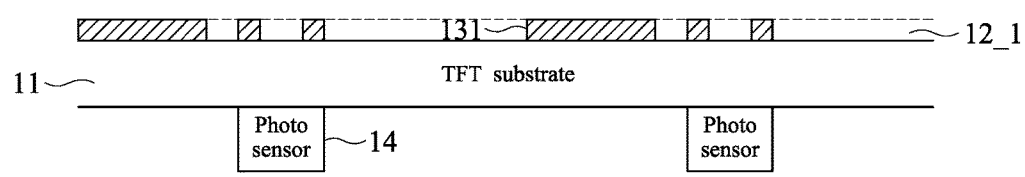
FIG. 7A to FIG. 7G show cross-sectional views illustrated of a method of forming the LED display of FIG. 6.
Figure 7B:
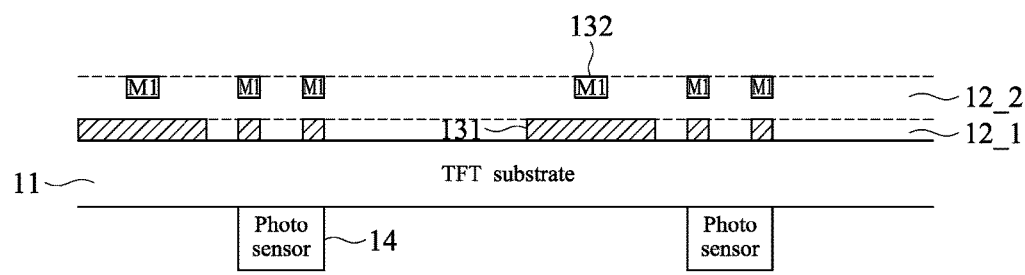
Figure 7C:
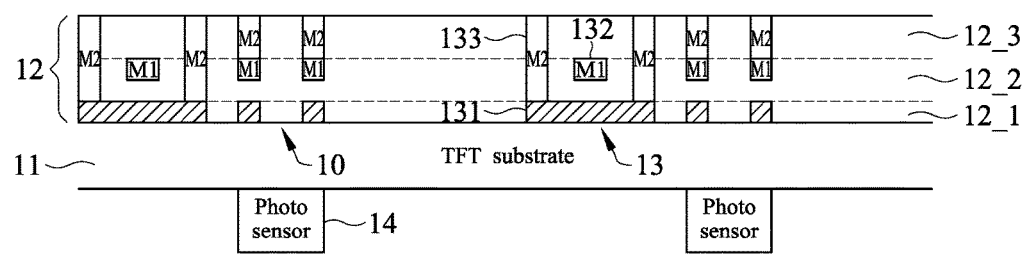
Figure 7D:
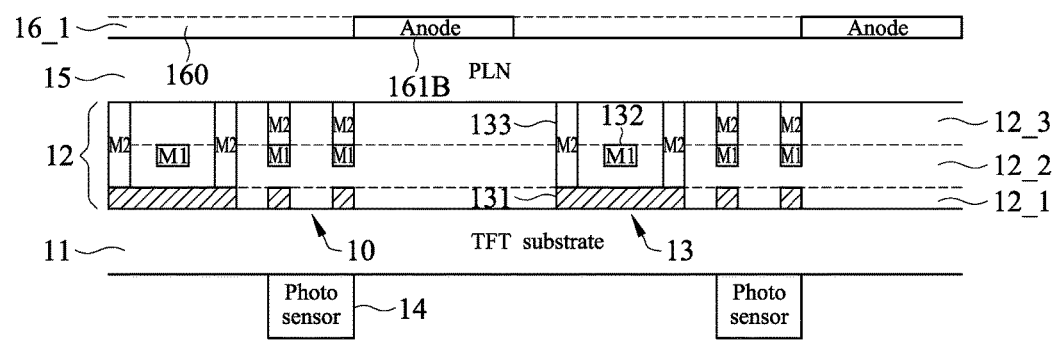
Figure 7E:
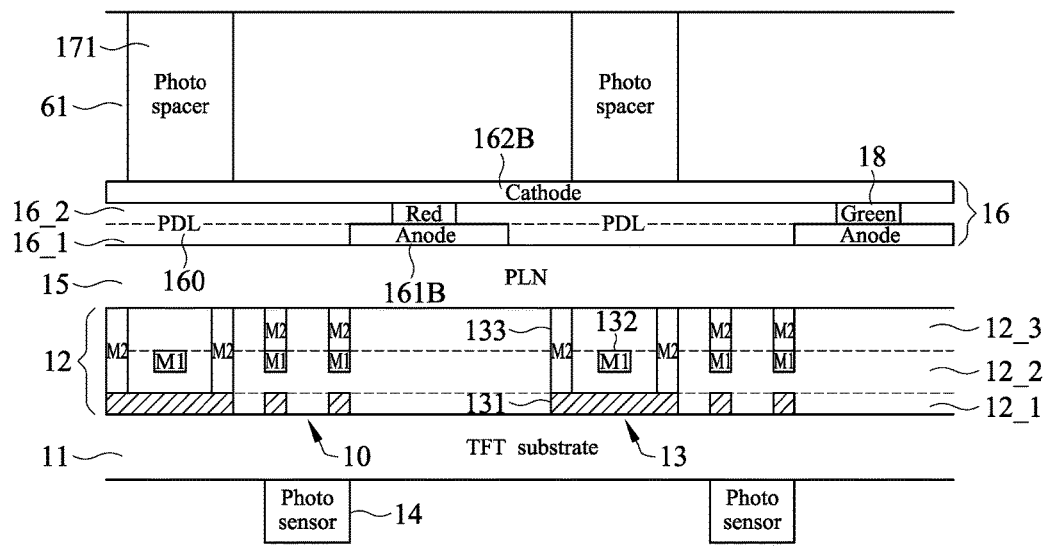
Figure 7F:
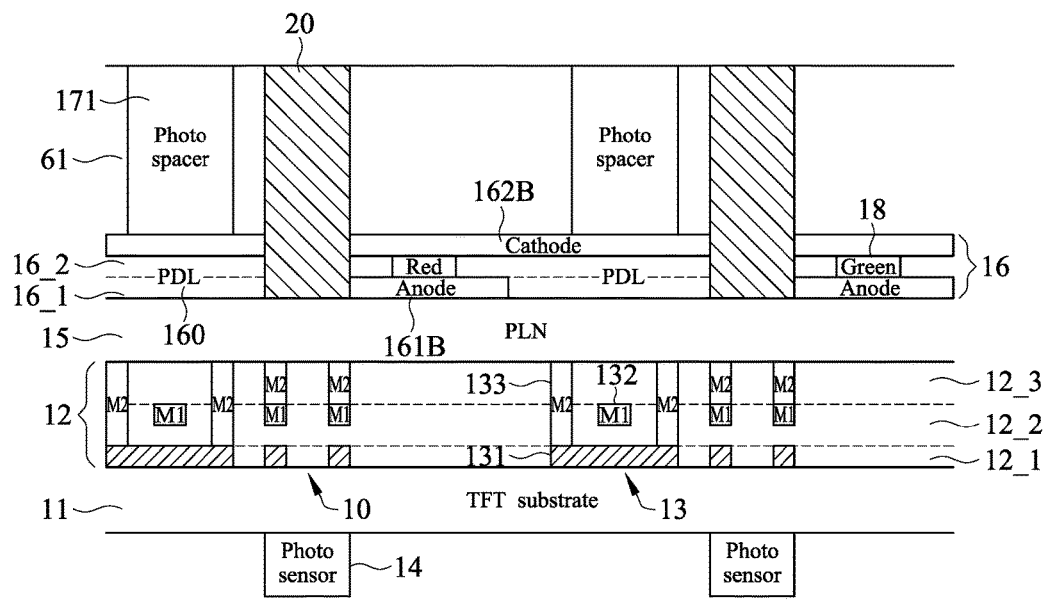
Figure 7G:
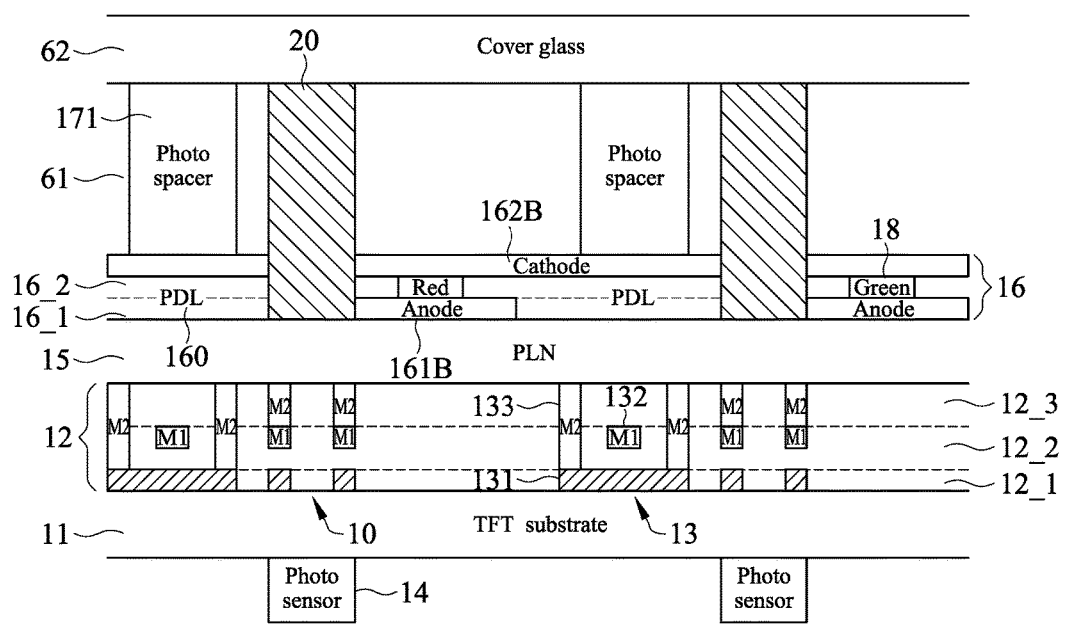

FIG. 7A to FIG. 7G show cross-sectional views illustrated of a method of forming the LED display 400 of FIG. 6. It is appreciated that the method of forming the LED display 400 may be performed in sequences other than that exemplified in FIG. 7A to FIG. 7G. Specifically, in FIG. 7A, a first layer 12_1 of a first dielectric layer 12 is formed on a top surface of a TFT substrate 11, followed by forming a polysilicon layer 131 in the first layer 12_1 of the first dielectric layer 12. At least one photo sensor (or photo detector) 14 is formed on a bottom surface of the TFT substrate 11. In FIG. 7B, a second layer 12_2 of the first dielectric layer 12 is formed on the first layer 12_1 of the first dielectric layer 12, followed by forming a first metal layer (M1) 132 in the second layer 12_2 of the first dielectric layer 12. In FIG. 7C, a third layer 12_3 of the first dielectric layer 12 is formed on the second layer 12_2 of the first dielectric layer 12, followed by forming a second metal layer (M2) 133 in the third layer 12_3 of the first dielectric layer 12. Accordingly, the TFT 13 and the light barrier 10 are formed in the first dielectric layer 12. In FIG. 7D, a planarization (PLN) layer 15 is formed over the first dielectric layer 12. Next, a first layer 16_1 of a second dielectric layer 16 is formed on the planarization layer 15, followed by forming an anode layer 161B in the first layer 16_1 of the second dielectric layer 16. In the embodiment, the second dielectric layer 16 may include a transparent pixel define layer (PDL) 160. In FIG. 7E, a second layer 16_2 of the second dielectric layer 16 is formed on the first layer 16_1 of the second dielectric layer 16, followed by forming a color filter (CF) layer 18 in the second layer 16_2 of the second dielectric layer 16. Next, a cathode layer 162B is formed on the second layer 16_2 of the second dielectric layer 16. An encapsulation layer 61 is formed over the second dielectric layer 16, and at least one transparent photo spacer 171 is formed in the encapsulation layer 61 to isolate adjacent pixels from each other. In FIG. 7F, at least one lens region 20 is formed in the encapsulation layer 61 and the second dielectric layer 16. The lens region 20 is connected to a top surface of the planarization layer 15, and is substantially aligned with the photo sensor 14 vertically. Finally, in FIG. 7G, a cover glass 62 is formed to cover the encapsulation layer 61, the photo spacer 171 and the lens region 20.

Figure 8:
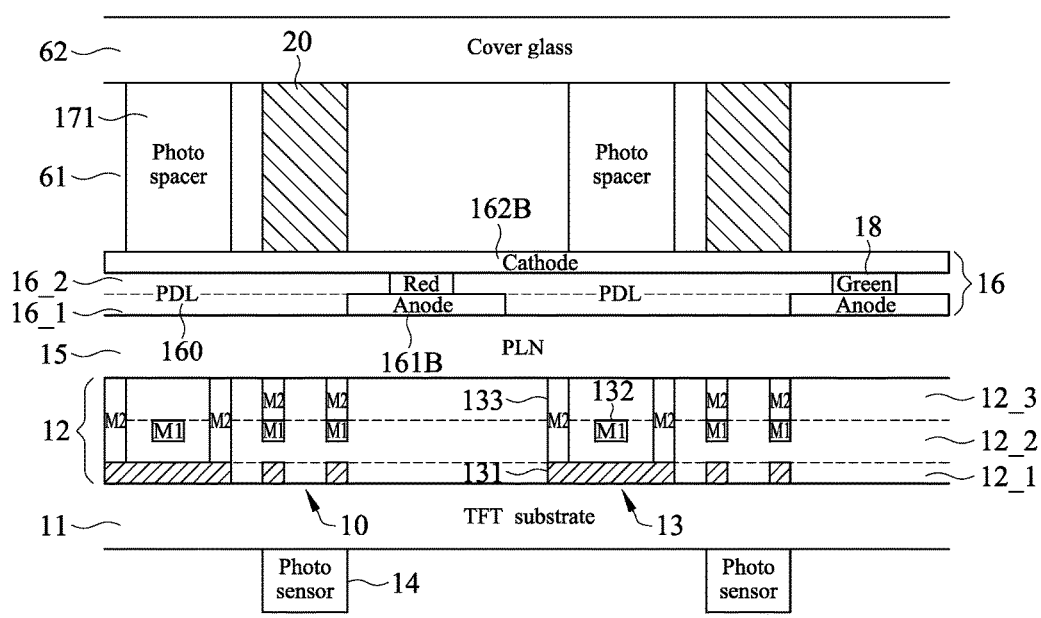
FIG. 8 shows a cross-sectional view of a light-emitting diode (LED) display embedded with a fingerprint sensor according to a fourth embodiment of the present invention.

FIG. 8 shows a cross-sectional view of a light-emitting diode (LED) display 500 embedded with a fingerprint sensor, which is integrated in an active area of the LED display 500, according to a fourth embodiment of the present invention. The present embodiment is similar to the third embodiment (FIG. 6) with the exceptions that will be described below.

In the embodiment, the lens region 20 is disposed above the second dielectric layer 16 (e.g., on the cathode layer 162B), and is substantially parallel to the photo spacer 171.

The lens region 20 may include a transparent material, which may be the same as or different from the photo spacer 171.

Figure 9A:
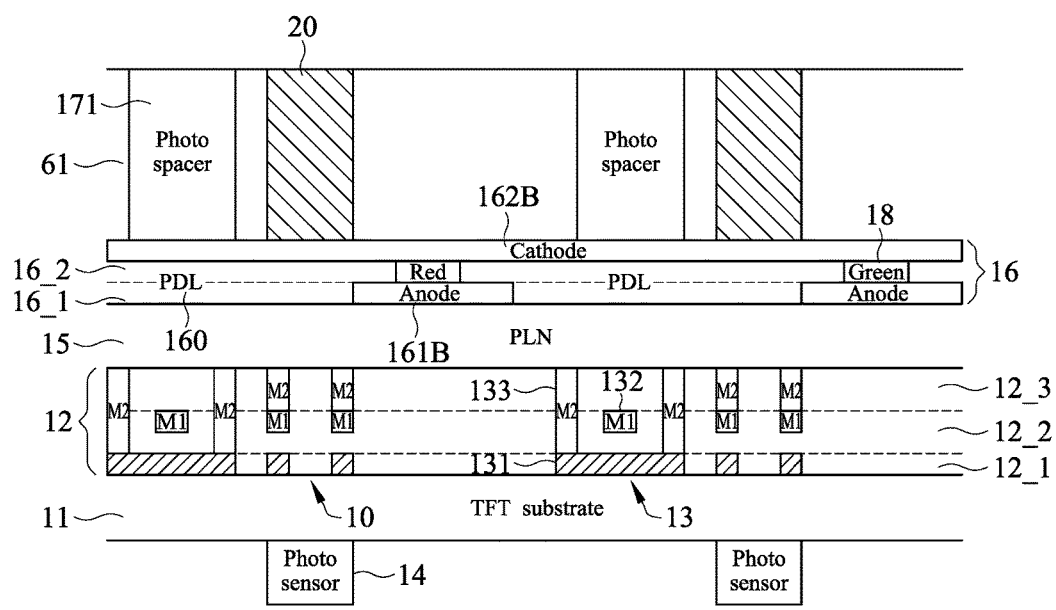
FIG. 9A to FIG. 9B show cross-sectional views illustrated of a method of forming the LED display of FIG. 8.
Figure 9B:
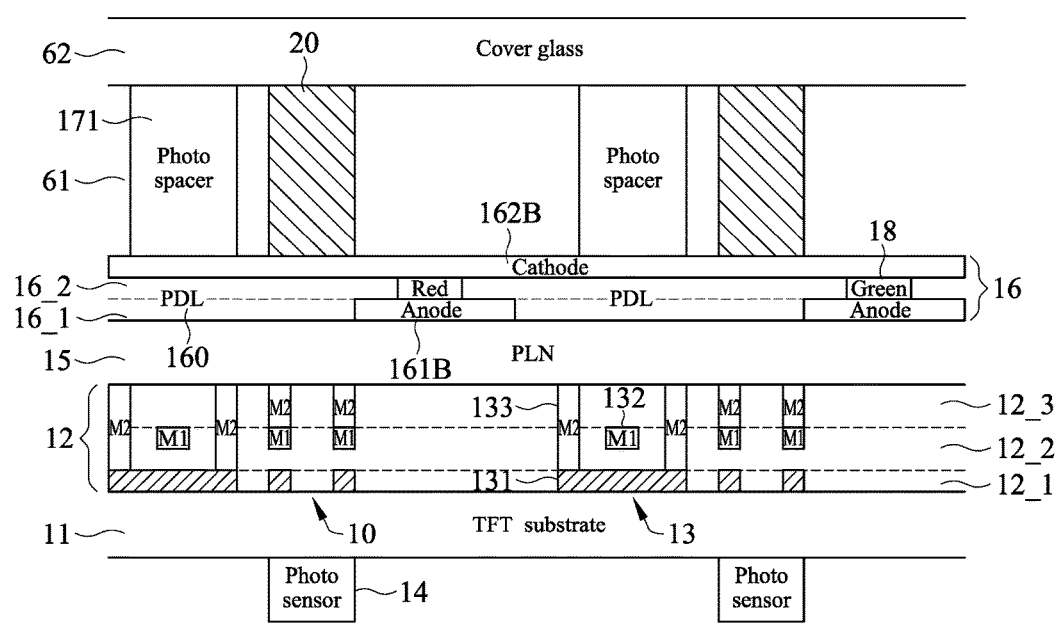

FIG. 9A to FIG. 9B show cross-sectional views illustrated of a method of forming the LED display 500 of FIG. 8. It is appreciated that the method of forming the LED display 500 may be performed in sequences other than that exemplified in FIG. 9A to FIG. 9B. The method of the embodiment may include same steps as shown in FIG. 7A to FIG. 7E. Subsequently, in FIG. 9A, at least one lens region 20 is formed in the encapsulation layer 61. The lens region 20 is connected to a top surface of the second dielectric layer 16, and is substantially aligned with the photo sensor 14 vertically.

Finally, in FIG. 9B, a cover glass 62 is formed to cover the encapsulation layer 61, the photo spacer 171 and the lens region 20.

Figure 10:
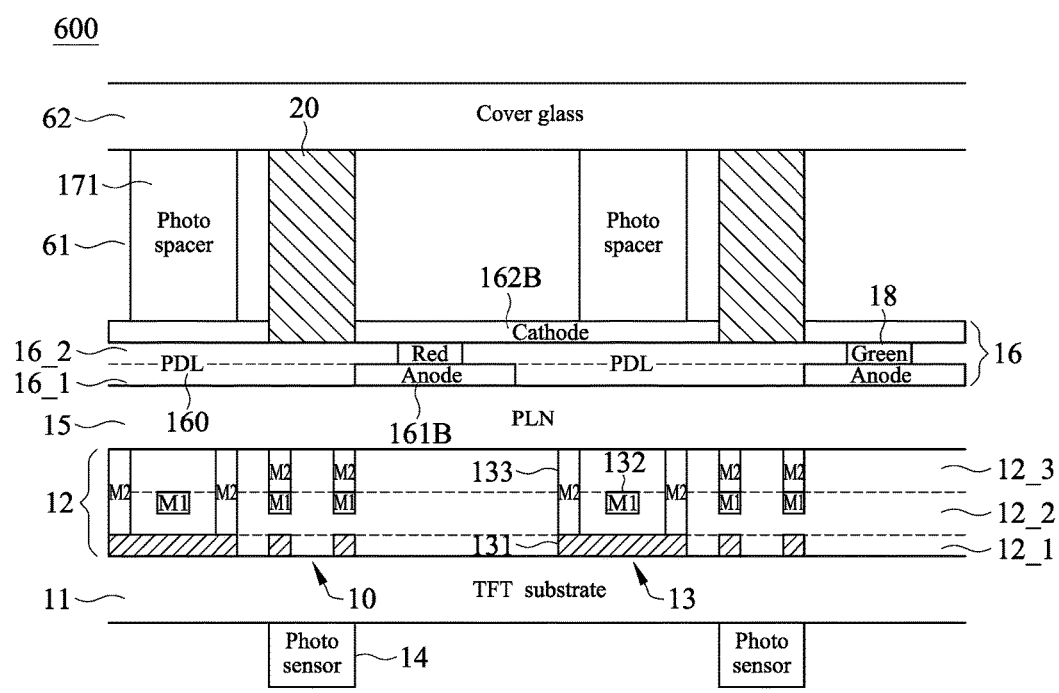
FIG. 10 shows a cross-sectional view of a light-emitting diode (LED) display embedded with a fingerprint sensor according to a fifth embodiment of the present invention.

FIG. 10 shows a cross-sectional view of a light-emitting diode (LED) display 600 embedded with a fingerprint sensor, which is integrated in an active area of the LED display 600, according to a fifth embodiment of the present invention. The present embodiment is similar to the third embodiment (FIG. 6) with the exceptions that will be described below.

In the embodiment, the lens region 20 is protruded upwards from, and connected to, a top surface of the pixel define layer (PDL) 160. The lens region 20 may include a transparent material, which may be the same as or different from the PDL layer 160. Specifically, the lens region 20 is elongated vertically and passes through the second dielectric layer 16 and above.

Figure 11A:
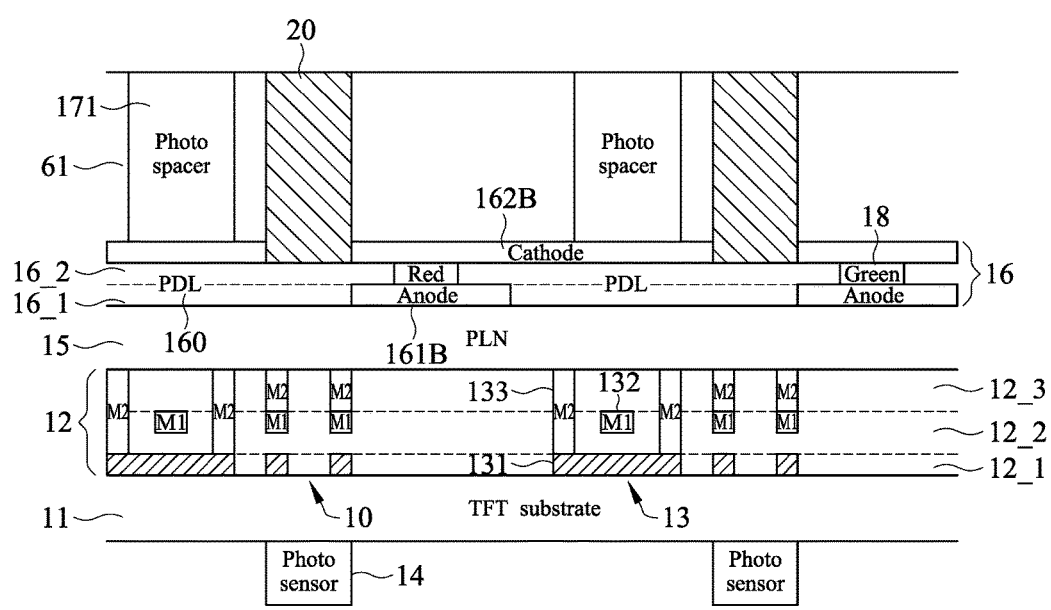
FIG. 11A to FIG. 11B show cross-sectional views illustrated of a method of forming the LED display of FIG. 10.
Figure 11B:
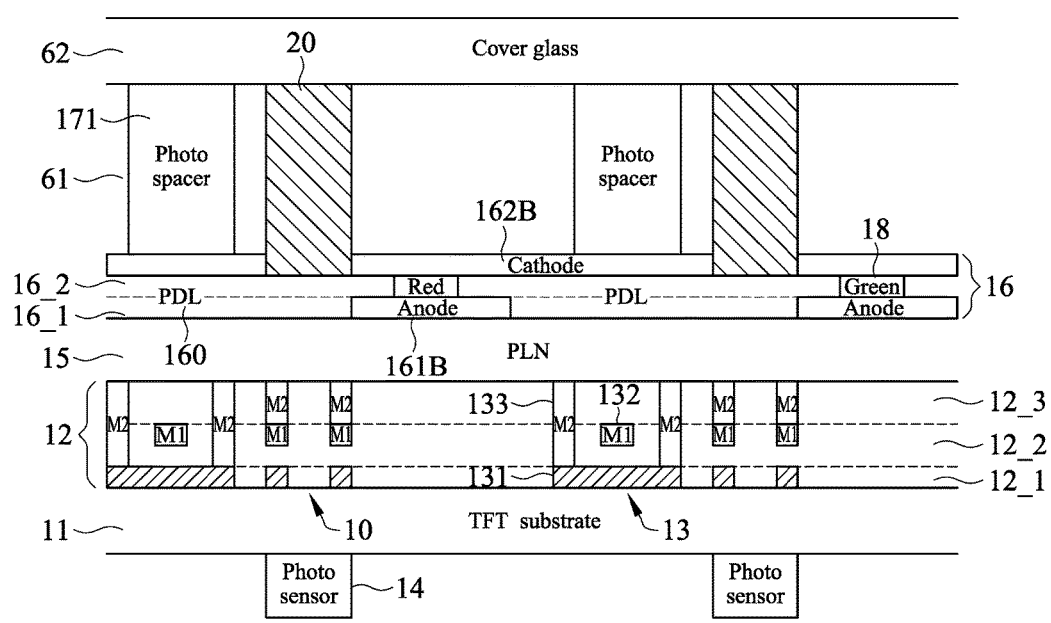

FIG. 11A to FIG. 11B show cross-sectional views illustrated of a method of forming the LED display 600 of FIG. 10. It is appreciated that the method of forming the LED display 600 may be performed in sequences other than that exemplified in FIG. 11A to FIG. 11B. The method of the embodiment may include same steps as shown in FIG. 7A to FIG. 7E. Subsequently, in FIG. 11A, at least one lens region 20 is formed in the encapsulation layer 61 and the second dielectric layer 16. The lens region 20 is connected to the PDL layer 160, and is substantially aligned with the photo sensor 14 vertically. Finally, in FIG. 11B, a cover glass 62 is formed to cover the encapsulation layer 61, the photo spacer 171 and the lens region 20.

Although specific embodiments have been illustrated and described, it will be appreciated by those skilled in the art that various modifications may be made without departing from the scope of the present invention, which is intended to be limited solely by the appended claims.

What is claimed is:

1. A flat-panel display embedded with a fingerprint sensor, comprising:
   a substrate;
   a photo sensor formed on a bottom surface of the substrate;
   a lens region disposed above and substantially aligned with the photo sensor vertically; and
   a light barrier substantially aligned with the photo sensor vertically and disposed between the photo sensor and the lens region;
   wherein a liquid crystal layer for constructing a liquid crystal display or an encapsulation layer for constructing a light-emitting diode display is disposed above the light barrier, the lens region vertically passing through the liquid crystal layer or the encapsulation layer; wherein a first dielectric layer formed on a top surface of the substrate, wherein the light barrier is formed on the first dielectric layer, wherein the light barrier comprises: a polysilicon layer; a first metal layer formed above the polysilicon layer; and a second metal layer formed on the first metal layer; wherein the polysilicon layer, the first metal layer and the second metal layer surround a passage; wherein a light beam representing a fingerprint passes the lens region and the passage, and is then detected by the photo sensor.

2. The flat-panel display of claim 1, further comprising a transparent planarization layer with a substantially smooth top surface, formed over the first dielectric layer.

3. The flat-panel display of claim 2, wherein the lens region is protruded upwards from, and connected to, a top surface of the planarization layer.

4. The flat-panel display of claim 2, further comprising:
   a second dielectric layer formed on the planarization layer; and
   a photo spacer disposed above the second dielectric layer.

5. The flat-panel display of claim 4, wherein the lens region is disposed on the second dielectric layer, and is substantially parallel to the photo spacer.

6. The flat-panel display of claim 4, wherein the second dielectric layer comprises a transparent pixel define layer.

7. The flat-panel display of claim 6, wherein the lens region is protruded upwards from, and connected to, a top surface of the pixel define layer.

8. The flat-panel display of claim 1, further comprising a color filter layer, wherein the photo sensor is in an active display area not overlapping with a black filter of the color filter layer.

9. A method of forming a flat-panel display embedded with a fingerprint sensor, comprising the following steps:
   providing a substrate;
   forming a photo sensor on a bottom surface of the substrate;
   forming a lens region above and substantially aligned with the photo sensor vertically; and
   forming a light barrier substantially aligned with the photo sensor vertically and disposed between the photo sensor and the lens region;
   wherein a liquid crystal layer for constructing a liquid crystal display or an encapsulation layer for constructing a light-emitting diode display is disposed above the light barrier, the lens region vertically passing through the liquid crystal layer or the encapsulation layer; wherein a step of forming a first dielectric layer on a top surface of the substrate, wherein the light barrier is formed in the first dielectric layer; wherein the light barrier comprises: a polysilicon layer; a first metal layer formed above the polysilicon layer; and a second metal layer formed on the first metal layer; wherein the polysilicon layer, the first metal layer and the second metal layer surround a passage; wherein a light beam representing a fingerprint passes the lens region and the passage, and is then detected by the photo sensor.

10. The method of claim 9, further comprising a step of forming a transparent planarization layer with a substantially smooth top surface, over the first dielectric layer.

11. The method of claim 10, wherein the lens region is protruded upwards from, and connected to, a top surface of the planarization layer.

12. The method of claim 10, further comprising:
   forming a second dielectric layer on the planarization layer; and
   forming a photo spacer above the second dielectric layer.

13. The method of claim 12, wherein the lens region is disposed on the second dielectric layer, and is substantially parallel to the photo spacer.

14. The method of claim 12, wherein the second dielectric layer comprises a transparent pixel define layer.

15. The method of claim 14, wherein the lens region is protruded upwards from, and connected to, a top surface of the pixel define layer.

16. The method of claim 9, further comprising a step of forming a color filter layer, wherein the photo sensor is in an active display area not overlapping with a black filter of the color filter layer.

* * * * *